United States Patent [19]

Kurasawa et al.

[11] Patent Number: 5,572,116

[45] Date of Patent: Nov. 5, 1996

[54] SURGE COUNTER

[75] Inventors: Koichi Kurasawa; Yoshiyuki Tanaka; Takaaki Itoh, all of Saitama-ken, Japan

[73] Assignee: Mitsubishi Materials Corporation, Tokyo, Japan

[21] Appl. No.: 345,220

[22] Filed: Nov. 28, 1994

Related U.S. Application Data

[63] Continuation-in-part of Ser. No. 949,468, Sep. 22, 1992, abandoned.

[30] Foreign Application Priority Data

Sep. 27, 1991 [JP] Japan .................................. 3-277003

[51] Int. Cl.⁶ .................................................. G01R 19/65
[52] U.S. Cl. ...................... 324/103 P; 324/122; 324/133
[58] Field of Search ........................... 324/103 P, 103 R, 324/102, 122, 133; 361/91; 377/1, 53

[56] References Cited

U.S. PATENT DOCUMENTS 3,141,107  7/1964  Wasserman ............................. 324/122
4,769,283  1/1989  Brunner et al. ........................ 324/102

FOREIGN PATENT DOCUMENTS 1089064  9/1960  Germany ............................... 324/122
59-211984  5/1983  Japan .

*Primary Examiner*—Ernest F. Karlsen
*Attorney, Agent, or Firm*—McAulay Fisher Nissen Goldberg & Kiel, LLP

[57] ABSTRACT

A surge detecting element which is connected to surge invading lines and is composed of a gap type discharge tube and a nonlinear resistor both connected in series with each other and one or more of surge absorbing elements each having an impulse discharge starting voltage higher than an impulse discharge starting voltage of the surge detecting element. A light receiving element is provided for the gap type discharge tube in light receiving relationship therewith for detecting a discharge light thereof, a counter circuit for counting a detected signal from the light receiving element is also provided.

15 Claims, 2 Drawing Sheets

SURGE COUNTER

This is a continuation-in-part of application Ser. No. 07/949,468 filed Sep. 22, 1992, now abandoned.

BACKGROUND OF THE INVENTION

1. Field of the Invention

The present invention relates to a surge counter which is provided on various lines, such as a surge counter for power supply lines and communication lines to count the number of times invading surges invade into these lines.

2. Description of the Related Art

If surges invade power supply lines for communication equipment such as telephone sets, facsimiles, telephone switching boards, modems, and the like, the communication equipment's electronic circuits are damaged by a fire. Therefore, conventionally, surge absorbers are provided on input lines of the power supply line, communication line and the like for communication equipment which is installed in a region where the surges tend to generate.

In order to protect the communication equipment from surges securely by means of the surge absorber, the specifications of the surge absorbers must be determined based on the results of statistical investigations of the generating times of the surges around the area where the communication equipment is to be installed.

Conventionally, for example, a surge counter for recording the number of times of invading surges has been disclosed in Unexamined Published Japanese Patent Application No.59-211984. The aforementioned surge counter comprises: a surge detecting element which is connected to the surge invading line and which is formed by connecting a gap type glass sealed discharge tube and a nonlinear resistor in series; a light receiving element for detecting a light emission from the discharge tube; and a counter circuit for counting the signals detected from the light receiving element. In this counter, since the surge input circuit and the surge detecting circuit are independent, there is no possibility that the surge will be detected by the detecting circuit, and besides, the advantage for the design of the detecting circuit to be done easily exists.

Moreover, in the foregoing conventional surge counter, a surge current withstanding capability of the surge current detecting element is selected by relating it to another surge current withstanding capability which is provided by the glass sealed discharge tube and the nonlinear resistor in series therewith. Hence, in case a surge current exceeds the surge current withstanding capability of the glass sealed discharge tube and the nonlinear resistor, such surge then invades into the surge current detecting element, and there is a fear that the glass sealed discharge tube or nonlinear resistor may be destroyed.

SUMMARY OF THE INVENTION

An object of the invention is to provide a surge counter and having a high input impedance, i.e., of at least about $10^8$ ohm, and preferably, at least about $10^{10}$ ohm, and capable of increasing the surge current withstanding capability and counting the number of times invading surges invade the lines with high reliability and without fear of invasion of a surge to a surge detecting circuit.

In a surge counter according to the invention, a surge detecting element $c_1$ and one or more of surge absorbing elements $c_2$, $c_3$, $c_4$, $c_5$ are connected in parallel with each other to surge invading lines A, A' (as shown in FIGS. 1 and 2). The surge detecting element $c_1$ consists of a gap type discharge tube $a_1$ and a nonlinear resistor $b_1$, both connected in series and each of surge absorbing elements $c_2$, $c_3$, $c_4$, $c_5$ has a higher impulse discharge starting voltage than the impulse discharge starting voltage of the surge detecting element $c_1$. A light receiving element d is positioned relative to the gap type discharge tube $a_1$ of the surge detecting element $c_1$ so as to detect a discharge light from the gap-type discharge tube $a_1$, and a counter circuit e for counting a detected signal of the light receiving element d responsive to light received from the gap-type discharge tube is provided.

As used herein, an impulse discharge starting voltage means a voltage at which a surge absorbing element starts a discharge when a pseudo surge is applied to the surge absorbing element as a specimen.

BRIEF DESCRIPTION OF THE DRAWING

The foregoing and other objects of this invention together with the advantages of the invention will become more readily apparent from a description of the preferred embodiment thereof with reference to the accompanying drawings.

DESCRIPTION OF THE PREFERRED EMBODIMENT

A gap type discharge tube according to the invention employs an air gap type discharge tube, a gas filled discharge tube, a micro-gap type glass sealed discharge tube or the like. A nonlinear resistor for the gap type discharge tube uses a zinc oxide varistor, a silicon carbide varistor or the like. In particular, the zinc oxide varistor which has both a large nonlinear factor and a large varistor-effect is suitable. For a light receiving element, a photoconductive element containing a polycrystalline substance such as CdS, CdSe, PbS, etc., as a main component may be utilized.

Figure 1:
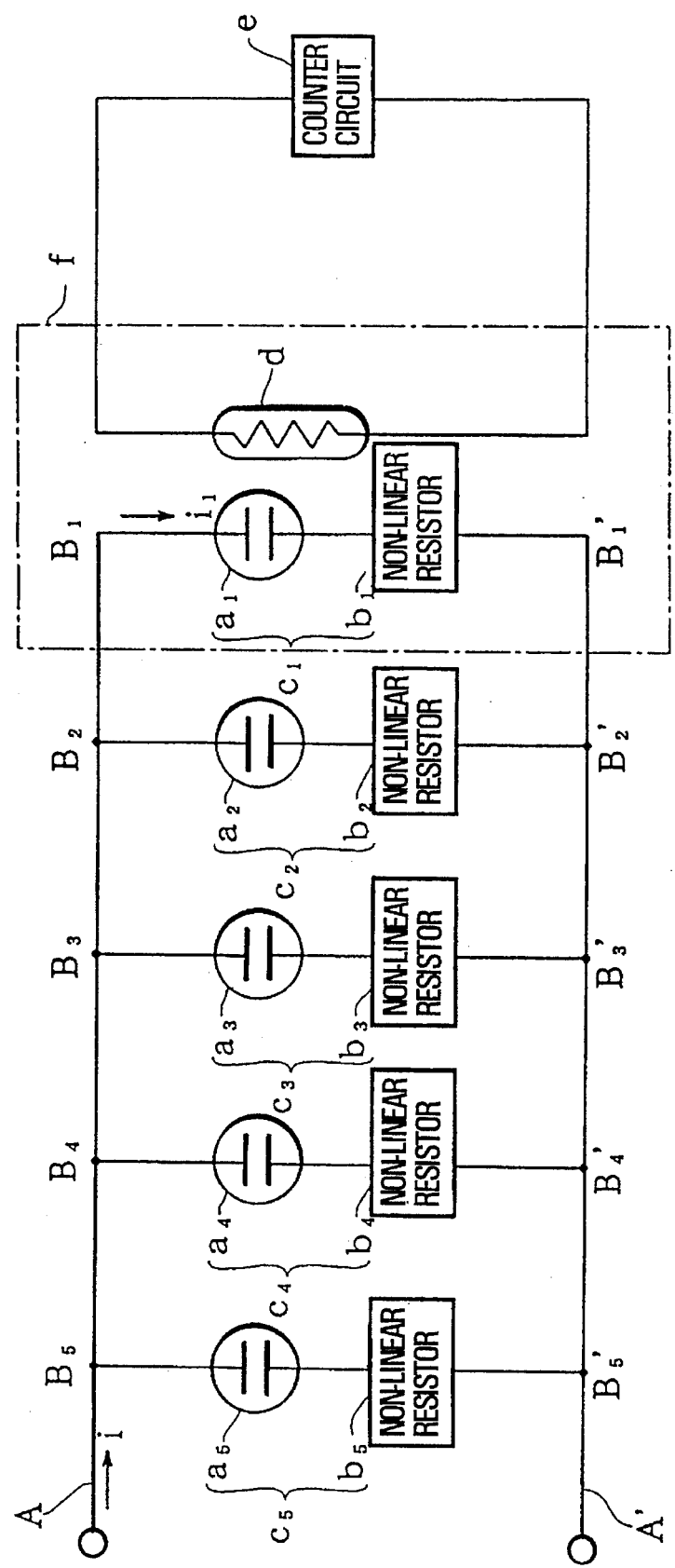
FIG. 1 is a block diagram of one embodiment of a surge counter according to the invention.

FIG. 1 illustrates, for easier understanding, one surge detecting element $c_1$ and four surge absorbing elements $c_2$, $c_3$, $c_4$, and $c_5$; it is understood to those skilled in the art that the number of the surge absorbing elements is not limited to such four units, but, any of the number of the surge absorbing elements such as $c_2$, $c_3$, $c_4$, and $c_5$ may be employed.

The one surge detecting element $c_1$ and surge absorbing elements $c_2$, $c_3$, $c_4$, and $c_5$ are connected in parallel to surge invading lines A and A'. In this arrangement, the surge currents which invade lines A and A' are distributed into the five elements $c_1$, $c_2$, $c_3$, $c_4$, and $c_5$. When n units of elements are provided, the surge current is distributed into each of n units of elements.

The surge absorbing element $c_1$ is formed of a gap type glass sealed discharge tube $a_1$ and a nonlinear resistor $b_1$ both connected in series with each other. In the same manner, each of the surge absorbing elements $c_2$ to $c_5$, in FIG. 1, are formed of gap type glass sealed discharge tubes $a_2$ to $a_5$ and nonlinear resistors $b_2$ to $b_5$. The nonlinear resistors $b_1$ to $b_5$ are each provided for preventing each of the discharge tubes $a_1$ to $a_5$ from generating a follow current because the lines A and A' always have a power supply voltage imposed thereon. The term "follow current" means the current at power frequency that passes through a discharge path after a high-voltage surge has started the discharge.

A light receiving element d is provided for discharge tube $a_1$ in light receiving relationship therewith, to detect a light discharge of the discharge tube $a_1$. A detected output from the light receiving element d is connected to a counter circuit e. Light receiving element d emits a signal which is counted by counter e in response to light emitted from discharge tube $a_1$. The discharge tube $a_1$ and the light receiving element d are contained in a dark box f to be free of interruptions or interferences from outside light or light not emitted from the discharge tube $a_1$.

$V_1$ represents an impulse discharge starting voltage from the surge detecting element $c_1$, and $V_2$, $V_3$, $V_4$, and $V_5$ represent impulse starting voltages from the surge absorbing elements $c_2$, $c_3$, $c_4$, and $c_5$, respectively. The discharge starting voltages of the discharge tubes $a_1$ to $a_5$ and varistor voltages of the varistors $b_1$ to $b_5$ are selected so that $V_1$ is minimum. $V_1$, $V_2$, $V_3$, $V_4$, and $V_5$ are set so that one or more elements among the surge absorbing elements $c_2$, $c_3$, $c_4$, and $c_5$ are responsive to a voltage which is generated across points $B_1$ and $B_1'$ on lines A and A', respectively due to a surge current flowing when the surge detecting element $c_1$ first responds.

Figure 2:
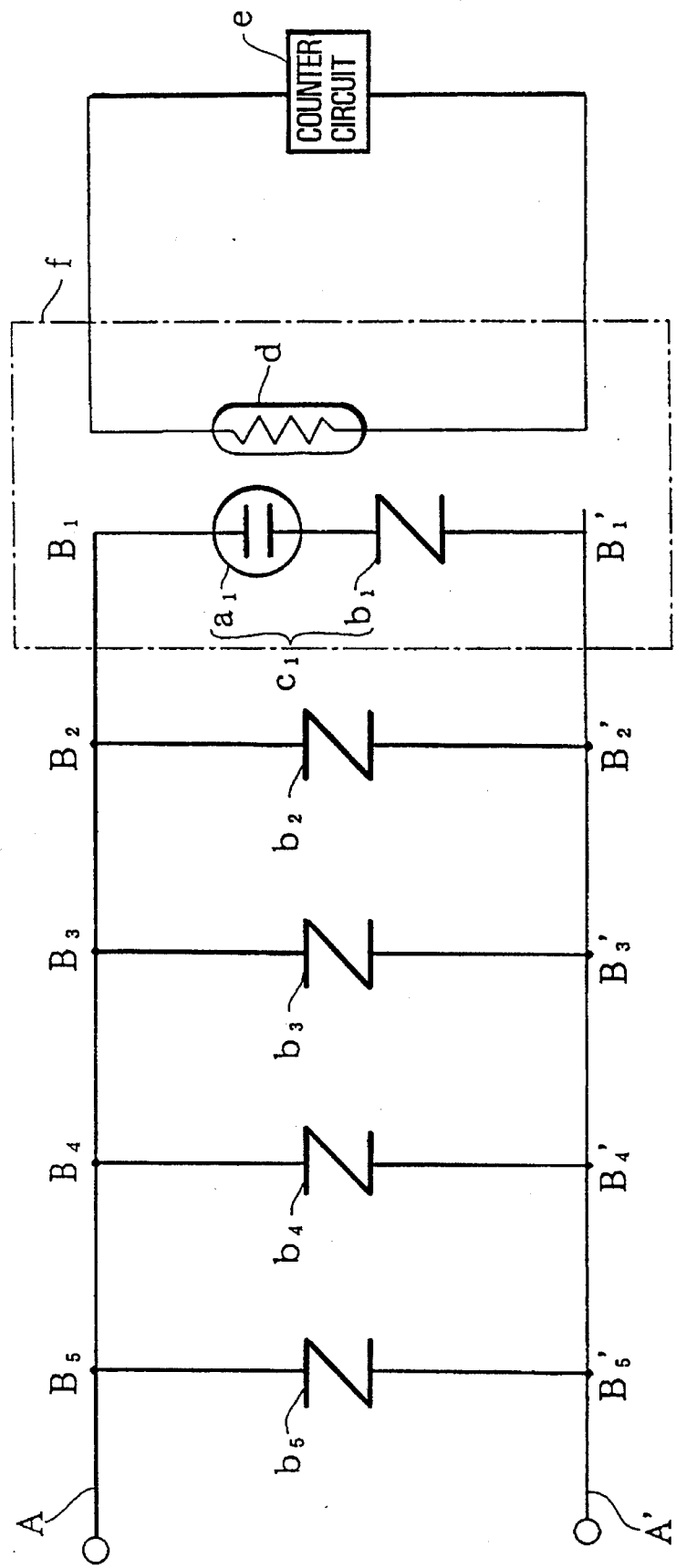
FIG. 2 is a block diagram of another embodiment of a surge counter according to the invention.

Referring now more particularly to FIG. 2, the surge absorbing elements may be formed of only the nonlinear resistors $b_2$ to $b_5$. In all other respects, the circuit is the same as that shown in FIG. 1 and like reference characters denote the same elements.

In operation, the surge voltage is applied to the lines A and A' to first cause a response from the surge protecting element $c_1$ (FIG. 2) having an impulse discharge starting voltage $V_1$ with a minimum value among the voltages $V_1$ to $V_5$. A discharge light from the discharge tube $a_1$ then securely enters light receiving element d to operate the counter circuit e by means of a detected signal from the light receiving element d which signal is produced in response to light from gas discharge tube $a_1$ (FIG. 2) impinging onto the light receiving element d.

At this time, if a surge current $i_1$ flows across the points $B_1$ and $B_1'$, a voltage corresponding to a product of a sum of a resistance value of the discharge tube $a_1$ on discharging plus a resistance value of the nonlinear resistor $b_1$ and the current value $i_1$ is generated across the points $B_1$ and $B_1'$, then the voltage thus generated is applied respectively in order across the points $B_1$ and $B_1'$, $B_2$ and $B_2'$, . . . , and $B_5$ and $B_5'$; hence, the surge absorbing elements $c_2$, $C_3$, $C_4$, and $C_5$ respond to cause current flows. In this manner, the surge currents are distributed into one or more units of the surge absorber elements by connecting one or more of surge absorbing elements $c_2$, $C_3$, $C_4$, and $C_5$ in parallel with the surge detecting element $c_1$.

The surge counter according to the invention is capable of counting the number of the invading surges by the surge detecting element and distributing the surge current into the surge absorbing elements. By providing one or more of the surge absorbing elements, this thus upgrades the surge current compared with that of a conventional single surge detecting element.

The present invention is described and explained in greater detail with reference to the following examples, although the invention is not limited to these examples.

EXAMPLE 1

As shown in FIG. 1 there is used a micro-gap type glass sealed discharge tube for the gap type discharge tubes $a_1$ to $a_5$, the zinc oxide varistor for the nonlinear resistors $b_1$ to $b_5$, and CdS for the light receiving element d. The light receiving element d confronts or faces the discharge tube $a_1$. A surge detecting element $c_1$ was formed by a discharge tube $a_1$ and a varistor $b_1$, and surge absorbing elements $c_2$ to $c_5$ were formed by means of discharge tubes $a_2$ to $a_5$ and surge absorbing elements $b_2$ to $b_5$, respectively.

In this Example, the direct-current discharge starting voltages were specified as 300 V for the discharge tube $a_1$, and 700 V for each of the discharge tubes $a_2$ to $a_5$. The varistor voltage was specified as equal to 220 V, for the varistor $b_1$, and 270 V, respectively, for each of the varistors $b_2$ to $b_5$. Measured values of surge currents which were withstood with respect to the surge detecting element $c_1$ and the surge absorbing elements $c_2$ to $c_5$ were 2000 A, respectively. A measured value of the surge current withstanding capability across lines A and A' of the surge counter then becomes 10,000 A, which is equal to five times the surge current withstanding capability value of a single unit surge detecting element or of a single unit surge absorbing element.

EXAMPLE 2

This Example employed a micro-gap type glass sealed discharge tube for a gap type discharge tube $a_1$, a zinc oxide system varistor for nonlinear resistors $b_1$ to $b_5$, and CdS for a light receiving element d as shown in FIG. 2. As in the case of Example 1, a surge detecting element $c_1$ was formed from a discharge tube $a_1$ and a varistor $b_1$. Surge absorbing elements were only formed by means of individual varistors $b_2$ to $b_5$.

In this Example, a direct-current discharge starting voltage of the discharge tube $a_1$ was specified as 300 V. Varistor voltages were specified as 220 V for the varistor $b_1$ and 620 V respectively for the varistors $b_2$ to $b_5$. Measured values of the surge currents withstanding capability for the surge detecting element $c_1$ and the varistors $b_2$ to $b_5$ forming and serving as the surge absorbing element were each respectively equal to 2000 A. The surge current withstanding capability across the lines A and A' of the surge counter became 10,000 A, and it is equal to five times the surge current withstanding capability of the single surge detecting element or each of the individual surge absorbing elements.

While there has been shown what is considered to be the preferred embodiments of the invention, various changes and modifications may be made therein without departing from the scope of the invention.

What is claimed is:

1. A surge counter comprising first and second stages,
    said first stage comprising:
        a surge detecting element having a first discharge starting voltage, the surge detecting element including a first discharge tube serially connected to a first nonlinear resistor, the first discharge tube having an illuminated state and a non-illuminated state; and,
        counting means for counting a number of times the first discharge tube changes from the non-illuminated state to the illuminated state,
    said second stage comprising:
        a surge absorbing element having a second discharge starting voltage,
    the first and second stages being connected in parallel across a pair of lines, the first discharge starting voltage being less than the second discharge starting voltage, and the surge counter having a high input impedance.

2. The surge counter as claimed in claim 1, wherein said surge absorbing element comprises a second nonlinear resistor.

3. The surge counter as claimed in claim 2, wherein said second nonlinear resistor is a zinc oxide varistor.

4. The surge counter as claimed in claim 2, wherein said second nonlinear resistor is a silicon carbide varistor.

5. The surge counter as claimed in claim 2, wherein said light receiving element is a photoconductive element containing a polycrystalline substance such as CdS, CdSe or PbS.

6. The surge counter according to claim 2 wherein the surge absorbing element further includes a second discharge tube serially connected to the second nonlinear resistor.

7. The surge counter as claimed in claim 6, wherein said nonlinear resistor is a zinc oxide varistor.

8. The surge counter as claimed in claim 6, wherein said nonlinear resistor is a silicon carbide varistor.

9. The surge counter as claimed in claim 6, wherein said second discharge tube is selected from the group consisting of an air gap type discharge tube, a gas filled discharge tube and a micro-gap type glass sealed discharge tube.

10. The surge counter as claimed in claim 1, wherein said first discharge tube is selected from the group consisting of an air gap type discharge tube, a gas filled discharge tube and a micro-gap type glass sealed discharge tube.

11. The surge counter according to claim 1 wherein the counting means comprises:

a light receiving element positioned adjacent to the first discharge tube for detecting light discharged from the first discharge tube, and a counter circuit connected to the light receiving element for counting signals sent from the light receiving element in response to light emitted from the first discharge tube.

12. The surge counter according to claim 1 wherein the counting means comprises a light receiving element, the light receiving element containing a polycrystalline substance selected from the group of polycrystalline substances consisting of CdS, CdSe and PbS.

13. The surge counter according to claim 1 wherein the counting means comprises a light receiving element, the light receiving element containing a CdS polycrystalline substance.

14. The surge counter of claim 1, which has an input impedance of at least about $10^8$ ohm.

15. The surge counter of claim 1, which has an input impedance of at least about $10^{10}$ ohm.

* * * * *